United States Patent [19]
Klingbeil, Jr. et al.

[11] Patent Number: 6,076,585
[45] Date of Patent: Jun. 20, 2000

[54] METHOD OF MANUFACTURING A SEMICONDUCTOR DEVICE AND APPARATUS THEREFOR

[75] Inventors: Lawrence Scott Klingbeil, Jr.; George C. Chen, both of Chandler, Ariz.

[73] Assignee: Motorola, Inc., Schaumburg, Ill.

[21] Appl. No.: 09/033,094

[22] Filed: Mar. 2, 1998

[51] Int. Cl.[7] .................................................. B32B 31/00
[52] U.S. Cl. ........................... 156/584; 156/344; 29/764; 269/903; 118/503
[58] Field of Search ..................................... 156/584, 344; 29/762, 764; 269/903; 118/503, 500; 438/4, 15, 456, 458, 459

[56] References Cited

U.S. PATENT DOCUMENTS

| | | | |
|---|---|---|---|
| 3,306,602 | 2/1967 | Scholer et al. | 269/903 X |
| 3,834,349 | 9/1974 | Dietze et al. | 118/500 |
| 4,104,099 | 8/1978 | Scherrer | 156/344 X |
| 4,171,740 | 10/1979 | Clement et al. | 206/213.1 |
| 4,473,455 | 9/1984 | Dean et al. | 118/503 X |
| 4,971,676 | 11/1990 | Doue et al. | 118/503 X |
| 5,273,615 | 12/1993 | Asetta et al. | 156/381 X |
| 5,472,086 | 12/1995 | Holliday et al. | |

OTHER PUBLICATIONS

William C. Howell, "The Direct Demount of Thinned GaAs Wafers to Sawing Tape", Conference on Gallium Arsenide Manufacturing Technology, 1990 MANTECH, pp. 48–51.

A. Quach et al., "A Robust Method of Dismounting and Handling of Thin GaAs Wafers", Symposium on Gallium Arsenide Manufacturing Technology, 1994 GaAs MANTECH, pp. 69–72.

*Primary Examiner*—Francis J. Lorin
*Attorney, Agent, or Firm*—Rennie William Dover

[57] ABSTRACT

A method of manufacturing a semiconductor device includes providing an apparatus (210, 510) having tabs (212, 214, 412, 414) for holding and separating semiconductor substrates wherein a first tab (212, 412) is different from a second tab (214, 414), using the first tab (212, 412) to support a semiconductor substrate (224) wherein the second tab (214, 414) does not support the semiconductor substrate (224), and exposing the semiconductor substrate (224) to a chemical to move the semiconductor substrate (224) towards the second tab (214, 414) without removing the semiconductor substrate (224) from the apparatus (210, 510).

23 Claims, 3 Drawing Sheets

METHOD OF MANUFACTURING A SEMICONDUCTOR DEVICE AND APPARATUS THEREFOR

BACKGROUND OF THE INVENTION

This invention relates, in general, to semiconductor devices, and more particularly, to apparati and methods for manufacturing semiconductor devices.

At a recent International Conference on Gallium Arsenide Manufacturing Technology (ManTech), the two largest causes for semiconductor wafer breakage during semiconductor device manufacturing were identified to be (1) the step of manually mounting semiconductor wafers onto support substrates and (2) the step of manually demounting the wafers from the substrates. The support substrates from the mounting step are used to reduce wafer breakage during wafer thinning, backside via etching, and other wafer backside processing steps. The demounting step occurs after the wafer backside processing steps and occurs before sawing the wafers into individual semiconductor devices. Wafer breakage at the mounting and demounting steps is very costly because these two steps are performed near the end of the manufacturing process after incurring most of the manufacturing costs.

The demounting step typically involves (1) placing the support substrate and the semiconductor wafer onto a heated surface to melt the adhesive that connects the substrate to the wafer and (2) manually pushing or sliding the wafer off of the substrate after the adhesive is melted to separate the wafer from the substrate. The wafers are extremely fragile during the demounting process because of the reduced wafer thicknesses after the wafer thinning process and also because of the many thousands of via holes after the backside via etching process. Human error during the manual performance of the demounting step is the main reason for the high incidents of wafer breakage during the demounting step.

Accordingly, a need exists for a non-manual method of demounting or separating a semiconductor substrate from a support substrate wherein the non-manual method does not break or otherwise fracture the semiconductor substrate.

BRIEF DESCRIPTION OF THE DRAWINGS

For simplicity and clarity of illustration, elements in the drawings are not necessarily drawn to scale. Furthermore, the same reference numerals in different Figures denote the same elements.

DETAILED DESCRIPTION OF THE DRAWINGS

Figure 1:
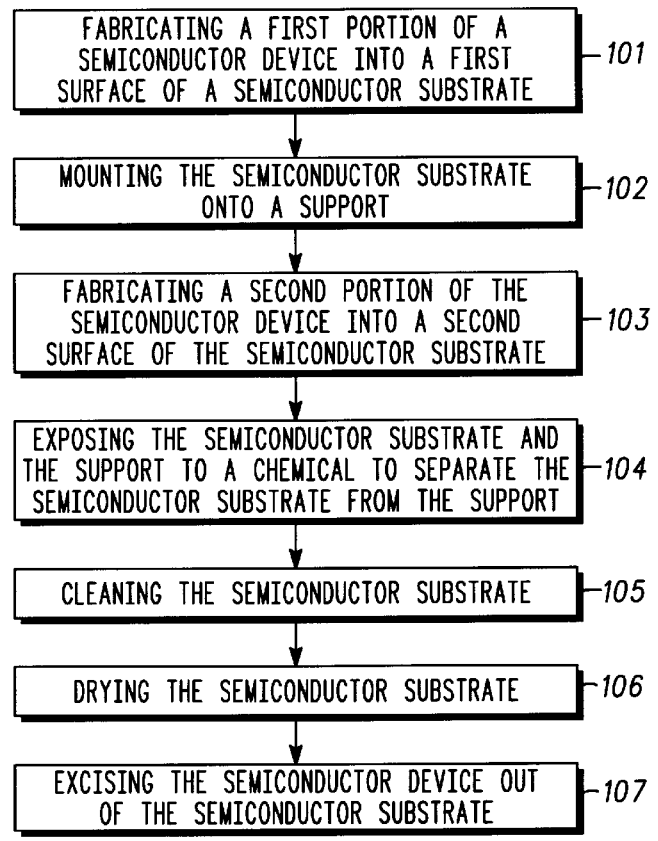
FIG. 1 outlines a method of manufacturing semiconductor devices in accordance with the present invention.

FIG. 1 outlines a method 100 of manufacturing semiconductor devices. Method 100 includes a step 101 for fabricating a first portion of a semiconductor device into a first surface of a semiconductor substrate or wafer. Step 101 includes doping regions of the first surface of the semiconductor substrate to form transistors, diodes, resistors, and the like. Step 101 can also include forming a multi-layer metallization scheme over the first surface of the semiconductor substrate to form an integrated circuit. Therefore, although the term semiconductor substrate is used hereinafter, it is understood that the semiconductor substrate can include non-semiconductor layers.

Method 100 continues with a step 102 for mounting the semiconductor substrate onto a support substrate or wafer. Step 102 includes using an adhesive to mount, attach, or otherwise couple the semiconductor substrate to the support substrate. In the preferred embodiment, the first surface of the semiconductor substrate faces towards and is covered by the adhesive and the support substrate while a second and opposite surface of the semiconductor substrate faces away from the support substrate and remains exposed. The adhesive comprises any material that is capable of withstanding elevated temperatures of up to approximately two hundred degrees Celsius during subsequent processing of the second surface of the semiconductor substrate. Examples of suitable adhesives include wax, photoresist, and double-sided tape.

After completing step 102, method 100 proceeds with a step 103 for fabricating a second portion of the semiconductor device into the second surface of the semiconductor substrate while the semiconductor substrate remains attached to the support substrate. The fabrication process of step 103 includes, for example, thinning the semiconductor substrate from approximately six hundred twenty-five micrometers to a thickness of approximately one hundred to twenty-five micrometers, etching source vias into the second surface, or depositing a metal into the source vias and onto the second surface of the semiconductor substrates. The thinning process often also reduces the diameter of the semiconductor substrate by a few millimeters.

Next, a step 104 exposes the semiconductor substrate and the support substrate to at least one chemical to separate the semiconductor substrate from the support substrate. Step 104 can be performed by inserting the semiconductor wafer and the support substrate into a wafer cassette while the semiconductor substrate remains attached to the support substrate. Then, the semiconductor substrate, the support substrate, and the wafer cassette can be submerged into a first solution to dissolve, melt, soften, or at least weaken the adhesive and to separate or release the semiconductor substrate from the support substrate. The substrates and the wafer cassette can be placed into a tank already filled with the first solution, or the substrates and the wafer cassette can be placed into an empty tank, which is later filled with the first solution.

The first solution can be a solvent or any other chemical that dissolves, melts, softens, or at least weakens the adhesive. In the preferred embodiment, the first solution does not substantially etch or otherwise attack the semiconductor substrates, the support substrates, or the wafer cassette. The first solution can be heated to reduce the time required to removed the semiconductor substrate from the support substrate. Furthermore, the first solution can be used simultaneously with an ultrasonic device to further improve the cycle time of step 104.

The first solution is preferably filtered during step 104 to remove contaminants from the first solution. A static bath is undesirable because of the resulting significant increase in the cycle time of step 104. However, the filtration of the first solution should not create a substantial amount of turbulence to ensure that the semiconductor substrate is not washed out of the wafer cassette.

Step 104 can also include subsequently submerging the semiconductor wafer into a second solution after the first submerging step. Preferably, the second submerging step occurs after the semiconductor substrate is already separated from the support substrate during the first submerging step. Also in the preferred embodiment, at least ninety to ninety-five percent of the adhesive is dissolved prior to the second submerging step. Furthermore, the first and second solutions preferably consist essentially of the same or similar chemical or chemicals. The second submerging step is used to ensure that the adhesive is completely removed from the first surface of the semiconductor substrate. The second solution can also be heated and can simultaneously be used with an ultrasonic device to reduce the cycle time of step 104. In an embodiment where photoresist is used for the adhesive, the second solution is preferably heated to a lower temperature than the first solution.

Method 100 continues with a step 105 for cleaning the semiconductor substrate. Step 105 can include, among other steps, rinsing the semiconductor substrate with deionized water or alcohol to remove the first and second solutions from the semiconductor substrate. If the deionized water is not heated to a similar temperature as the first solution or second solution, then the semiconductor substrates should be allowed to cool for several seconds prior to being cleaned in step 105. This short waiting period of approximately five to thirty-five seconds reduces the possibility of fracturing the semiconductor substrates due to thermal shock.

Then, a step 106 can be performed to dry the semiconductor substrate with a flow of gaseous nitrogen, argon, or the like. Preferably, step 106 does not spin or otherwise set the semiconductor substrate on its edge because of the fragility of the thinned semiconductor substrate.

Method 100 continues with a step 107 for sawing the semiconductor substrate to remove or excise the semiconductor device from the semiconductor wafer. The semiconductor device can then be packaged using methods known to those skilled in the art.

Figure 2:
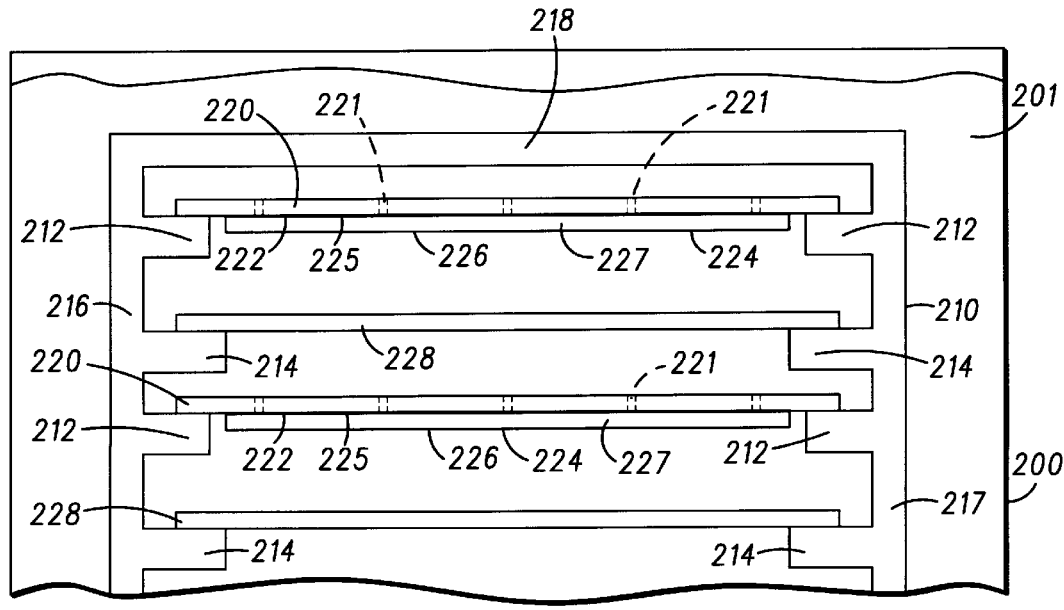
FIG. 2 illustrates a partial side view of an apparatus used to manufacture semiconductor devices during a particular manufacturing step in accordance with the present invention.

FIG. 2 illustrates a partial side view of an apparatus 210 used to manufacture semiconductor devices during step 104 of method 100 in FIG. 1. Apparatus 210 is a cassette for holding a plurality of semiconductor wafers or substrates 224. Apparatus 210 includes walls 216 and 217 that are substantially parallel to each other. A third wall 218 is substantially perpendicular to both of walls 216 and 217 and couples together walls 216 and 217. Walls 216 and 217 each have a plurality or set of protrusions or tabs 212 and 214. In the preferred embodiment, apparatus 210 is identical to a conventional wafer cassette, except that each of tabs 212 are approximately one to three millimeters shorter than those of a conventional wafer cassette for reasons explained hereinafter.

Tabs 212 and 214 of wall 216 extend from wall 216 toward wall 217, and tabs 212 and 214 of wall 217 extend from wall 217 toward 216. Tabs 212 and 214 of wall 216 are separated from and do not physically contact wall 217, and tabs 212 and 214 of wall 217 are separated from and do not physically contact wall 216. Additionally, tabs 212 and 214 are different from each other. In particular, tabs 212 of wall 216 are shorter than tabs 214 of wall 216, and tabs 212 of wall 217 are shorter than tabs 214 of wall 217. Furthermore, tabs 214 of wall 216 are located between adjacent tabs 212 of wall 216, and tabs 214 of wall 217 are located between adjacent tabs 212 of wall 217. Moreover, as illustrated in FIG. 1, one of tabs 212 of wall 216 is closer to wall 218 than any of tabs 214 of walls 216, respectively, and one of tabs 212 of wall 217 is closer to wall 218 than any of tabs 214 of walls 217, respectively.

In the preferred embodiment, tabs 212 of walls 216 and 217 are have approximately equal lengths and are substantially identical to each other, and tabs 214 of walls 216 and 217 have approximately equal lengths and are substantially identical to each other. Furthermore, each of tabs 212 of wall 216 is preferably substantially coplanar with one of tabs 212 of wall 217, and each of tabs 214 of wall 216 is preferably substantially coplanar with one of tabs 214 of wall 217. Also in the preferred embodiment, tabs 212 and 214 are all substantially parallel with each other and with wall 218. Moreover, the spacing between wall 218 and the first ones of tabs 212 of walls 216 and 217 is preferably the same as the spacing between any of adjacent tabs 212 and 214 of wall 216 and is also preferably the same as the spacing between any of adjacent tabs 212 and 214 of wall 217.

Semiconductor substrates 224 have a first major surface 225 opposite a second major surface 226. Portions of semiconductor devices 227 have been previously formed in surfaces 225 during step 101 of method 100 in FIG. 1. As discussed earlier, substrates 224 can include dielectric, metal, and other layers over surfaces 225.

Substrates 224 are coupled to support substrates 220 wherein surfaces 225 of substrates 224 face towards substrates 220 while surfaces 226 of substrates 224 remain exposed. Each of substrates 220 are preferably comprised of an optically transparent substrate to facilitate the processing of surface 226 during step 103 of method 100 in FIG. 1. In particular, the optically transparent characteristic of substrate 220 enables the location of alignment keys on surface 225 of substrate 224. As an example, substrates 220 can be comprised of quartz or sapphire. Substrates 220 are larger than substrates 224 by preferably about one to three millimeters before step 103 of method 100 in FIG. 1. Substrates 220 also preferably have a plurality of holes 221 therethrough for reasons explained hereinafter.

Adhesives 222 are located between substrates 220 and 224 to couple substrates 220 and 224 together. As described earlier, adhesives 222 can be comprised of wax, photoresist, double-sided tape, or the like. In the preferred embodiment, adhesives 222 are preferably optically transparent for the same reasons as described earlier for substrate 220.

After substrates 220 and 224 are coupled together with adhesives 222, substrates 220 and 224 and adhesives 222 are subjected to step 103 of method 100 in FIG. 1. Then, substrates 220 and 224 are simultaneously positioned, inserted, or otherwise disposed into apparatus 210 above tabs 212. As illustrated in FIG. 1, tabs 212 of walls 216 and 217 support substrates 220 and 224. However, tabs 212 preferably only contact substrates 220 and preferably do not contact substrate 224 so that tabs 212 do not hinder the subsequent separation of substrates 220 and 224. To prevent tabs 212 from contacting substrate 224, the shortest distance between walls 216 and 217 is preferably larger than the diameter of substrate 220 by a distance of at least one millimeter; the shortest distance between the distal ends of tabs 212 is preferably larger than the diameter of substrate 224 by at least the same distance; and substrate 224 is preferably mounted in the middle of or concentric with substrate 220.

Tabs 212 separate substrates 220 and 224 from support substrates 228, which are supported by tabs 214 of walls 216 and 217. At this point in the process, tabs 214 do not support either of substrates 220 or 224, and tabs 214 and 212 separate each of substrates 228 from each of substrates 220 and 224. Substrate 228 preferably has a roughed surface facing towards overlying substrate 224 for reasons explained hereinafter. As an example, substrate 228 can be comprised of silicon, sapphire, TEFLON® material manufactured by DuPont Corporation of Wilmington, Del., or the like.

After substrates 220, 224, and 228 are positioned within apparatus 210, apparatus 210 is positioned such that each of tabs 214 are positioned below at least one of tabs 212. Thus, as illustrated in FIG. 2, tabs 212 support substrates 220 and 224; tabs 214 support substrates 228; and the major surfaces of substrates 220, 224, and 228 are substantially perpendicular to the force of gravity. While in this position, substrates 224 are exposed to at least one chemical to separate or release substrate 224 from substrate 220, and then gravity moves substrate 224 away from tabs 212 and towards tabs 214 without removing substrate 224 from apparatus 210, as explained in more detail hereinafter.

In the preferred embodiment, apparatus 210 and substrates 220, 224, and 228 are submerged into a liquid solution 201 that dissolves, melts, softens, or at least weakens adhesives 222 to separate substrates 220 and 224. Solution 201 can be a solvent or other suitable chemical. For example, if adhesives 222 are a photoresist, then solution 201 can be a photoresist stripper such as ST-22 manufactured by Advanced Chemical Systems International, Incorporated in Milpitas, Calif. As another example, if adhesives 222 are a wax, then solution 201 can be hot water. In the preferred embodiment, apparatus 210 and substrates 220, 224, and 228 are not substantially affected by solution 201.

Holes 221 in each of substrates 220 enable solution 201 to dissolve, melt, soften, or weaken adhesives 222 from the back sides of substrates 220. Thus, optional holes 221 can be used to reduce the cycle time of step 104 of method 100 in FIG. 1. In the preferred embodiment, only solution 201, gravity, and perhaps ultrasonic waves are used to separate substrates 220 and 224.

Figure 3:
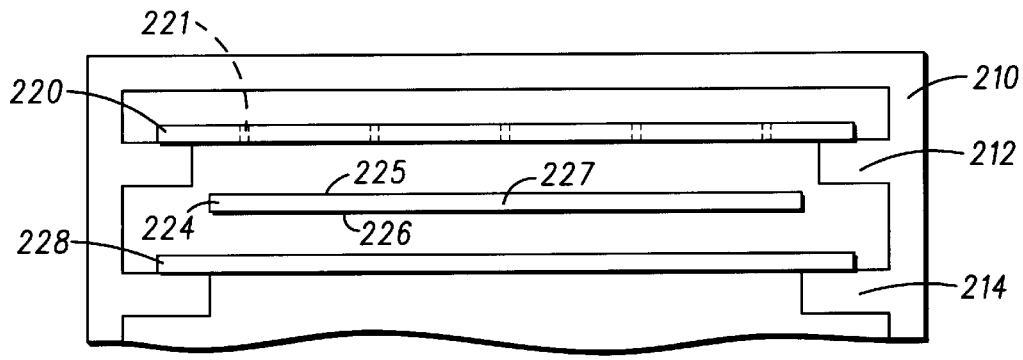
FIGS. 3 and 4 illustrate simplified partial side views of the apparatus and the semiconductor devices at later times during the manufacturing process in accordance with the present invention.

FIG. 3 illustrates a simplified partial side view of apparatus 210 and substrates 220, 224, and 228 at a later time during step 104 of method 100 in FIG. 1. Tank 200 and solution 201 are not illustrated in FIG. 3 to simplify the explanation of the present invention. The present Figure illustrates the preferred embodiment where adhesive 222 of FIG. 2 as already been substantially dissolved and where substrate 224 is released from substrate 120. In FIG. 3, gravity moves substrate 224 away from tabs 212, away from substrate 220, and downward towards adjacent tabs 214 and substrate 228 without removing substrate 224 from apparatus 210. This downward movement is achieved by ensuring that the distance between tabs 212 is at least slightly larger than the diameter of substrate 224. In the preferred embodiment, only gravity is used to produce the downward movement of substrate 224. As illustrated in FIG. 3, substrates 220 and 228 remain supported by tabs 212 and 214, respectively, during the descent of substrate 224.

Figure 4:
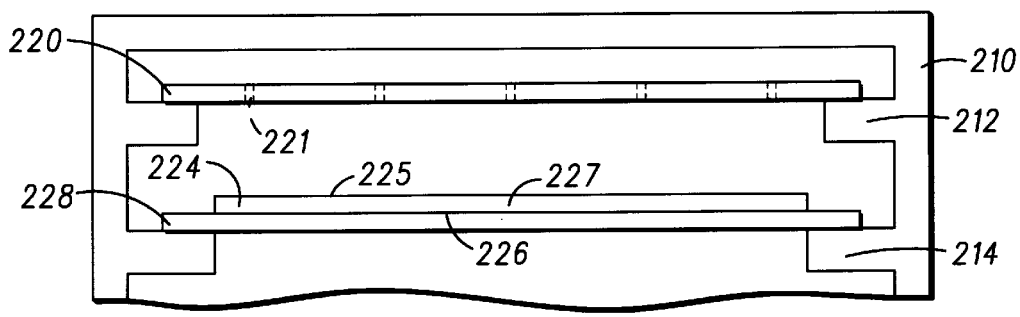

FIG. 4 illustrates a simplified partial side view of apparatus 210 and substrates 220, 224, and 228 at an even later time during step 104 of method 100 in FIG. 1. Tank 200 and solution 201 are not illustrated in FIG. 4 to simplify the explanation of the present invention. After falling from tabs 212, substrate 224 overlies and is supported by substrate 228, which is supported by tabs 214. Substrate 228 is located between tabs 214 and substrate 224 so that tabs 214 do not directly contact substrate 224. Thus, substrate 224 is no longer supported by tabs 212.

Then, apparatus 210 is removed from tank 200 and solution 201. In one embodiment, as described earlier with reference to steps 104, 105, and 106 of method 100 of FIG. 1, apparatus 210 and substrates 220, 224, and 228 can be submerged into a second solution or filtered bath, and substrates 224 can also be cleaned and dried. However, these subsequent steps preferably keep surfaces 225 and 226 of substrate 224 substantially perpendicular to gravity in order to reduce the probability of chipping or otherwise damaging the edges of substrate 224, which is extremely thin after step 103 in method 100 of FIG. 1.

Eventually, substrate 228 is removed out of apparatus 210 while substrate 224 rests on substrate 228. Then, substrate 224 is removed from substrate 228. In one embodiment, one-sided tape is placed onto substrate 224 to lift substrate 224 off of substrate 228. This one-sided tape is then also used to support substrate 224 during the wafer sawing process of step 107 in FIG. 1. The aforementioned rough surface of substrate 228 facilitates the removal of substrate 224 from substrate 228 by eliminating or at least reducing the hydroscopic and electrostatic forces between substrates 224 and 228. This surface of substrate 228 can also have bumps, holes, or other features to further facilitate the removal of substrate 224 from substrate 228. Only one surface of substrate 228 is required to have this rough or non-smooth characteristic.

Figure 5:
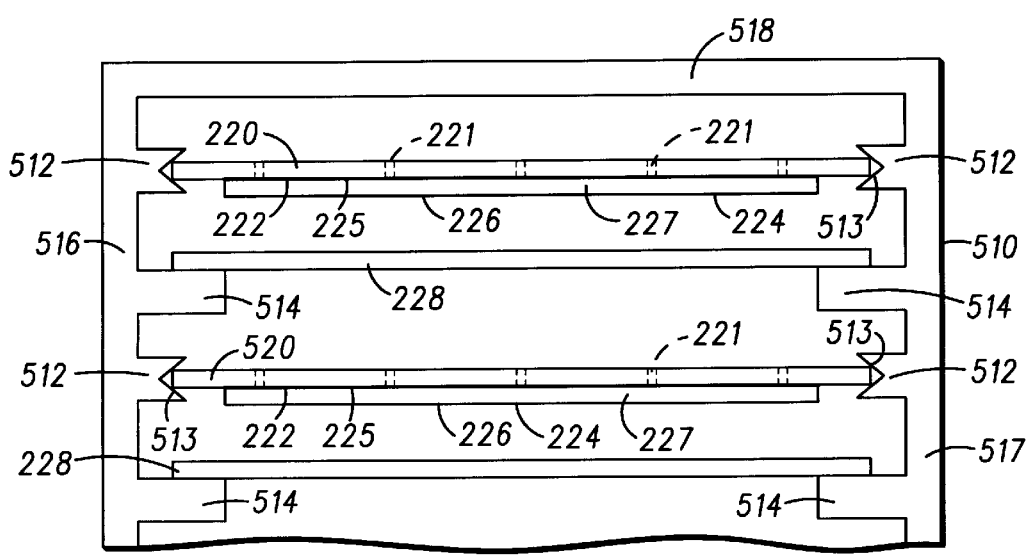
FIG. 5 illustrates a partial side view of an alternative embodiment of the apparatus of FIG. 2. in accordance with the present invention.

FIG. 5 illustrates a partial side view of an apparatus 510, which is an alternative embodiment of apparatus 210 in FIG. 2. In the preferred embodiment, apparatus 510 has walls 516, 517, and 518, which are identical to walls 216, 217, and 218, respectively, of apparatus 210 in FIG. 2. Apparatus 510 also has protrusions or tabs 512 and 514, which are preferably similar to tabs 212 and 214, respectively, of apparatus 210. In this preferred embodiment, apparatus 510 is the same as a conventional wafer cassette, except that tabs 512 are a few millimeters shorter than the tabs of a conventional wafer cassette and except that tabs 512 have grooves, keys, slots, or notches 513 at their distal ends. With this configuration of tabs 512, substrates 220 are positioned in notches 513 and in between tabs 512, instead of above tabs 212, as illustrated in FIG. 2.

Figure 6:
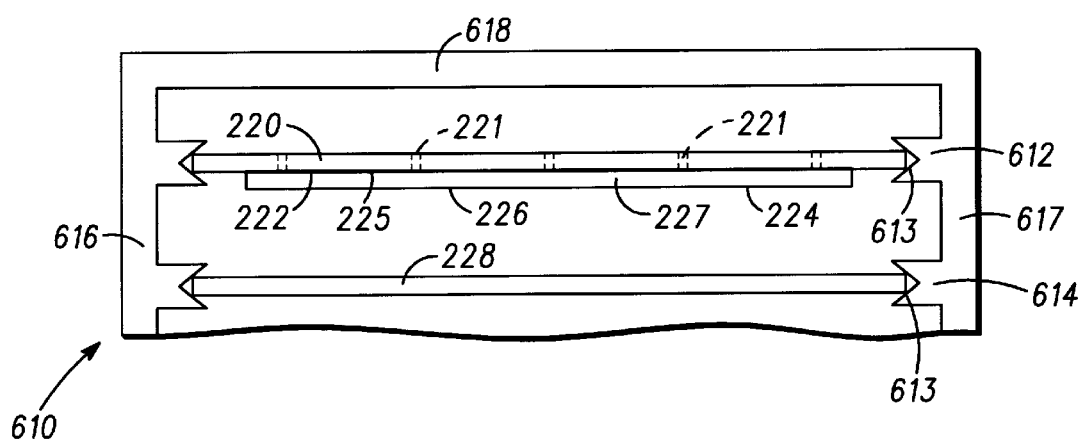
FIG. 6 illustrates a partial side view of another alternative embodiment of the apparatus of FIG. 2 in accordance with the present invention.

FIG. 6 illustrates a partial side view of an apparatus 610, which is another alternative embodiment of apparatus 210 in FIG. 2. In the preferred embodiment, apparatus 610 has walls 616, 617, and 618, which are identical to walls 216, 217, and 218, respectively, of apparatus 210 in FIG. 2. Apparatus 610 also has protrusions or tabs 612 and 614, which are preferably similar to tabs 212 and 214, respectively, of apparatus 210. In this preferred embodiment, apparatus 610 is the same as a conventional wafer cassette, except that tabs 612 and 614 are shorter than the tabs of a conventional wafer cassette and except that each of tabs 612 and 614 have grooves, keys, slots, or notches 613 and 615 at their respective distal ends. Tabs 612 and 614 can be the same length. With this configuration of tabs 612 and 614, substrates 220 are positioned in notches 613 and in between tabs 612, instead of above tabs 212, as illustrated in FIG. 2, and substrates 228 are positioned in notches 615 and in between tabs 614, instead of above tabs 214, as illustrated in FIG. 2.

Therefore, an improved method of manufacturing a semiconductor device and apparatus thereof is provided and overcomes the disadvantages of the prior art. The method of manufacturing automates a previously manual process for demounting wafers and reduces the high rates of wafer breakage due to human error. Additionally, the manufacturing method described herein is faster than the previous manual process. For instance, a single person can simultaneously process a batch of wafers, whereas under the previous manual process, a single person can only process a single wafer at a time. Moreover, when the wafer cassettes described herein are similar to conventional wafer cassettes, the conventional wafer cassettes can be inexpensively and quickly modified to practice the automated demounting process described herein.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the specific chemical compositions and dimensions are provided to facilitate the understanding of the present invention and are not provided to limit the scope of the invention. As another example, the use of substrate 228 is optional if tabs 214, 514, or 614 are long enough to support substrate 224 after being separated from substrate 220. However, the use of substrate 228 is preferred because of the pressure exerted upon substrate 224 when substrate 224 and apparati 210, 510, and 610 are removed from solution 201.

Furthermore, tabs 214, 514, and 614 and substrates 228 can be completely eliminated from apparati 210, 510, and 610. In this embodiment, substrates 224 simply fall down to rest on the back surface of a lower support substrate 220. In a different embodiment which still eliminates tabs 214, 514, and 614 and substrates 228, substrates 220 and 224 can be placed upside down within apparati 210, 510, and 610. For example, in FIG. 2, substrates 224 would now be located above tabs 212 instead of between tabs 212. In this embodiment, substrates 224 do not move after adhesive 222 is dissolved, which may help reduce wafer breakage. However, this embodiment makes the complete and thorough removal of adhesive 222 from surface 225 of substrate 224 much more difficult.

As another alternative embodiment, any suitable gas, vapor, or liquid chemical can be used for solution 201 to dissolve adhesive 222. However, the use of a liquid for solution 201 is preferred to reduce the velocity at which substrate 224 falls or floats towards substrate 228. By reducing the velocity, substrate 224 is less likely to break.

Moreover, a retaining mechanism can be added to apparati 210, 510, and 610 after inserting substrates 220, 224, and 228 to ensure that the substrates do not fall out of the apparati during the demounting process of step 104 in FIG. 1. This configuration of apparati 210, 510, and 610 is especially useful when the filtering of solution 201 causes a significant amount of turbulence.

Accordingly, the disclosure of the present invention is not intended to be limiting. Instead, the disclosure of the present invention is intended to be merely illustrative of the scope of the invention, which is set forth in the following claims.

What is claimed is:

1. A method of manufacturing a semiconductor device comprising:
   providing an apparatus having a tab;
   physically coupling a semiconductor substrate to a support substrate;
   inserting the semiconductor substrate and the support substrate into the apparatus;
   supporting the semiconductor substrate above the tab;
   separating the semiconductor substrate from the support substrate; and
   moving the semiconductor substrate towards the tab while keeping the semiconductor substrate in the apparatus.

2. The method of claim 1 further comprising:
   providing the semiconductor substrate coupled to a support substrate; and
   inserting the semiconductor substrate coupled to the support substrate into the apparatus wherein the first one of the tabs contacts and supports the support substrate and wherein the second one of the tabs is devoid of supporting the semiconductor substrate,
   wherein providing the apparatus further comprises providing the apparatus with a tabs for supporting semiconductor substrates wherein a first one of the tabs is located above a second one of the tabs.

3. The method of claim 2 wherein the providing step further comprises providing the support substrate comprised of an optically transparent substrate with holes, and wherein the inserting step further comprises preventing the first one of the tabs from contacting the semiconductor substrate.

4. The method of claim 2 wherein the inserting step further comprises simultaneously using the first one and a third one of the tabs to support the semiconductor substrate wherein a distance between the first and third ones of the tabs is larger than a diameter of the semiconductor substrate.

5. The method of claim 4 wherein the simultaneously using step further comprises positioning the support substrate above the first and third ones of the tabs to support the semiconductor substrate.

6. The method of claim 4 wherein the simultaneously using step further comprises positioning the support substrate between the first and third ones of the tabs to support the semiconductor substrate.

7. The method of claim 2 wherein the moving step further comprises moving the semiconductor substrate toward the second one and a third one of the tabs without removing the semiconductor substrate from the apparatus wherein a distance between the second and third ones of the tabs is smaller than a diameter of the semiconductor substrate.

8. The method of claim 2 further comprising supporting the semiconductor substrate with a support substrate in the apparatus wherein the support substrate is supported by the second one of the tabs before, during, and after the moving step, and wherein the support substrate is located between the second one of the tabs and the semiconductor substrate.

9. The method of claim 1 wherein the inserting step occurs after the physically coupling step and further comprises simultaneously inserting the semiconductor substrate and the support substrate into the apparatus,
   wherein the supporting step occurs after the inserting step and further comprises supporting the support substrate above the protrusion,
   wherein the separating step occurs after the supporting step, and
   wherein the moving step occurs after the separating step and further comprises moving the semiconductor substrate away from the support substrate, keeping the support substrate above the protrusion, and positioning a major surface of the semiconductor substrate substantially perpendicular to gravity wherein the gravity moves the semiconductor substrate towards the tab.

10. A method of manufacturing a semiconductor device comprising:
    mounting a semiconductor substrate onto a support substrate;
    providing an apparatus having a plurality of protrusions wherein a length of a first one of the plurality of protrusions is shorter than a length of a second one of the plurality of protrusions;

positioning the semiconductor substrate and the support substrate into the apparatus wherein the first one of the plurality of protrusions supports the support substrate and the semiconductor substrate;

exposing the semiconductor substrate to a chemical to release the semiconductor substrate from the support substrate; and moving the semiconductor substrate from the first one of the plurality of protrusions towards the second one of the plurality of protrusions while the support substrate remains supported by the first one of the plurality of protrusions.

11. The method of claim 10 wherein the providing step further comprises providing the first and second ones of the plurality of protrusions adjacent to each other and wherein the positioning step further comprises preventing the first and second ones of the plurality of protrusions from contacting the semiconductor substrate.

12. The method of claim 10 wherein the moving step further comprises using gravity to move the semiconductor substrate from the first one of the plurality of protrusions toward the second one of the plurality of protrusions.

13. The method of claim 10 wherein the mounting step includes providing the semiconductor substrate with a major surface and wherein the exposing and moving steps further comprise:

positioning the major surface substantially perpendicular to a force of gravity; and positioning the second one of the plurality of protrusions underneath the first one of the plurality of protrusions and below the semiconductor substrate.

14. The method of claim 10 further comprising using the second one of the plurality of protrusions to support the semiconductor substrate after the moving step wherein the support substrate remains supported by the first one of the plurality of protrusions during and after the moving step and wherein the support substrate is devoid of being supported by the second one of the plurality of protrusions during and after the moving step.

15. A method of manufacturing a semiconductor device comprising:

fabricating a first portion of the semiconductor device into a first surface of a semiconductor wafer wherein the semiconductor wafer has a second surface opposite the first surface;

using an adhesive to attach the semiconductor wafer to an optically transparent wafer after fabricating the first portion of the semiconductor device wherein the optically transparent wafer has holes therein, wherein the optically transparent wafer is larger than the semiconductor wafer, and wherein the first surface of the semiconductor wafer faces towards the optically transparent wafer;

fabricating a second portion of the semiconductor device into the second surface of the semiconductor wafer while the semiconductor wafer is attached to the optically transparent wafer;

providing a plurality of wafers in a wafer cassette having tabs;

inserting the semiconductor wafer into the wafer cassette while the semiconductor wafer is attached to the optically transparent wafer wherein the tabs separate the semiconductor wafer and the optically transparent wafer from the plurality of wafers in the wafer cassette and wherein the semiconductor wafer is devoid of physically contacting the tabs;

submerging the semiconductor wafer, the optically transparent wafer, the plurality of wafers, and the wafer cassette in a first solution to dissolve the adhesive and to separate the semiconductor wafer from the optically transparent wafer wherein the submerging step occurs after the two fabricating steps, wherein the first surface of the semiconductor wafer is positioned approximately perpendicular to a force of gravity during the submerging step, and wherein the force of gravity moves the semiconductor wafer from a first one of the tabs towards an adjacent one of the tabs during the submerging step;

cleaning the semiconductor wafer after the submerging step;

drying the semiconductor wafer after the cleaning step; and sawing the semiconductor wafer to remove the semiconductor device from the semiconductor wafer after the drying step.

16. The method of claim 15 further comprising submerging the semiconductor wafer into a second solution after submerging the semiconductor wafer into the first solution and before the cleaning step wherein the second submerging step occurs after the semiconductor wafer is separated from the optically transparent wafer and wherein the first and second solutions consist essentially of similar chemicals.

17. The method of claim 16 wherein the first submerging step includes heating the first solution to a first temperature and wherein the second submerging step includes heating the second solution to a second temperature lower than the first temperature.

18. The method of claim 15 wherein the submerging step further comprises using an ultrasonic process simultaneously with the first solution to separate the semiconductor wafer from the optically transparent wafer.

19. The method of claim 15 wherein the drying step includes preventing the semiconductor substrate from spinning.

20. The method of claim 15 further comprising using a support substrate to support the semiconductor wafer during the submerging step wherein the support substrate is supported by the adjacent one of the tabs wherein the adjacent one of the tabs is devoid of supporting the semiconductor wafer during the inserting step.

21. An apparatus for manufacturing a semiconductor device comprising a cassette for holding a plurality of semiconductor substrates wherein the cassette has first and second opposing walls; and a plurality of protrusions for separating the plurality of semiconductor substrates, wherein a first protrusion of a first set of the plurality of protrusions extends from the first wall and a second protrusion of the first plurality of protrusions extends from the second wall and wherein each protrusion of the first set of the plurality of protrusions has a first length, a first protrusion of a second set of the plurality of protrusions extends from the first wall and a second protrusion of the second plurality of protrusions extends from the second wall and wherein each protrusion of the second set of the plurality of protrusions has a second length, the second length less than the first length, and a first protrusion of a third set of the plurality of protrusions extends from the first wall and a second protrusion of the third plurality of protrusions extends from the second wall and wherein each protrusion of the third plurality of protrusions has a third length, the third length greater than the second length and wherein the first protrusion of the second set of the plurality of protrusions is located between the first protrusions of the first and third sets of the plurality of protrusions and the second protrusion of the second set of the plurality of protrusions is located between the second protrusions of the first and third sets of the plurality of protrusions.

22. An apparatus for manufacturing a semiconductor device comprising:

a first wall;

a second wall substantially parallel to the first wall and coupled to the first wall;

a first set of tabs coupled to the first wall and extending from the first wall towards the second wall wherein a first tab of the first set of tabs is shorter than a second tab of the first set of tabs and wherein the first and second tabs of the first set of tabs are adjacent to each other; and a second set of tabs coupled to the second wall and extending from the second wall toward the first wall wherein a first tab of the second set of tabs is shorter than a second tab of the second set of tabs, wherein the first and second tabs of the second set of tabs are adjacent to each other, wherein the first tabs of the first and second set of tabs have approximately equal lengths and are substantially coplanar with each other, wherein the second tabs of the first and second set of tabs have approximately equal lengths and are substantially coplanar with each other, and wherein the first and second tabs of the first and second set of tabs are substantially parallel with each other.

23. The apparatus of claim 22 further comprising a third wall coupling the first and second walls together wherein the third wall is substantially parallel to the first and second set of tabs, wherein the first tabs of the first and second set of tabs are closer to the third wall than the second tabs of the first and second set of tabs, and wherein a first distance between the third wall and the first tab of the first set of tabs is approximately equal to a second distance between the third wall and the first tab of the second set of tabs and is approximately equal to a third distance between the first and second tabs of the first set of tabs and is approximately equal to a fourth distance between the first and second tabs of the second set of tabs, wherein the first set of tabs further comprises:
a third tab adjacent to the second tab of the first set of tabs and having a length approximately equal to the first tab of the first set of tabs; and
a fourth tab adjacent to the third tab of the first set of tabs and having a length approximately equal to the second tab of the first set of tabs wherein the third tab of the first set of tabs is located between the second and fourth tabs of the first set of tabs, wherein the second set of tabs further comprises:
a third tab adjacent to the second tab of the second set of tabs and having a length approximately equal to the first tab of the second set of tabs wherein the third tab of the second set of tabs is approximately coplanar with the third tab of the first set of tabs; and
a fourth tab adjacent to the third tab of the second set of tabs and having a length approximately equal to the second tab of the second set of tabs wherein the fourth tab of the second set of tabs is approximately coplanar with the fourth tab of the first set of tabs and wherein the third tab of the second set of tabs is located between the second and fourth tabs of the second set of tabs, wherein the first set of tabs is physically separated from the second wall, wherein the second set of tabs is physically separated from the first wall, and wherein the first and second tabs of the first and second set of tabs have notches at their distal ends.

* * * * *

UNITED STATES PATENT AND TRADEMARK OFFICE
CERTIFICATE OF CORRECTION

| | |
|---|---|
| PATENT NO. | : 6,076,585 |
| DATED | : June 20, 2000 |
| INVENTOR(S) | : Lawrence Scott Klingbeil Jr. et al. |

It is certified that error appears in the above-identified patent and that said Letters Patent is hereby corrected as shown below:

<u>Title page,</u>
Item [75], Inventors, add -- Terry K. Daly of Gilbert Arizona. --

Signed and Sealed this

Tenth Day of September, 2002

Attest:

Attesting Officer

JAMES E. ROGAN
*Director of the United States Patent and Trademark Office*